United States Patent [19]

Suenaga et al.

[11] 3,731,162

[45] May 1, 1973

[54] SEMICONDUCTOR SWITCHING DEVICE

[75] Inventors: Masanobu Suenaga, Minami-ku, Yokohama; Tetsuo Machii, Meguro-ku, Tokyo; Syuji Sugioka, Yokohama, Tsurumi-ku, all of Japan

[73] Assignee: Tokyo Shibaura Electric Co., Ltd., Kawasaki-shi, Japan

[22] Filed: Sept. 22, 1970

[21] Appl. No.: 74,504

[30] Foreign Application Priority Data

Sept. 25, 1969 Japan..............................44/76101
Jan. 31, 1970 Japan..............................45/8278

[52] U.S. Cl. ...317/235 R, 317/235 AB, 317/235 AE
[51] Int. Cl...............................................H01l 11/10
[58] Field of Search......................................317/235

[56] References Cited

UNITED STATES PATENTS

| | | | |
|---|---|---|---|
| 3,577,046 | 5/1971 | Moyson | 317/235 |
| 3,364,440 | 1/1968 | Schreiner | 331/111 |
| 3,428,874 | 2/1969 | Gerlach | 317/235 |
| 3,372,318 | 3/1968 | Tefft | 317/235 |

*Primary Examiner*—John W. Huckert
*Assistant Examiner*—E. Wojciechowicz
*Attorney*—Kemon, Palmer & Estabrook

[57] ABSTRACT

A semiconductor switching device comprising a semiconductor body having at least four regions arranged in succession, the adjacent ones thereof being of different conductivity types, a pair of main electrodes mounted on both sides of the semiconductor body and a gate electrode disposed on that side of the semiconductor body on which there is provided one of the main electrodes and spaced from said main electrode, wherein there are provided semiconductor shielding regions or discontinuous recesses for obstructing the flow of a gate current on at least part of the surface of the region between the gate electrode and said one main electrode.

2 Claims, 32 Drawing Figures

INVENTORS
Masanobu Suenaga
Tetsuo Machii
BY Syuji Sugioka
Kemon Palmer & Estabrook
Attorneys INVENTORS
Masanobu Suenaga
Tetsuo Mashi
Seiji Sugioka
BY
Kemon, Palmer & Estabrook
Attorneys

INVENTORS

BY

INVENTORS
Masanobu Suenaga
Tetsuo Machii
Syuji Sugioka
BY

SEMICONDUCTOR SWITCHING DEVICE

BACKGROUND OF THE INVENTION

The present invention relates to a semiconductor switching device, and more particularly to improvements in a semiconductor switching device of multijunction such as a thyristor or triac which has at least three P-N junctions.

Generally such type of semiconductor switching device, for example, thyristor is formed by diffusing on both sides of a semiconductor substrate of a prescribed conductivity type of semiconductor regions of the opposite conductivity type to that of the substrate, forming in at least one of said semiconductor regions another semiconductor region of the same conductivity type as that of the substrate, mounting a cathode and anode electrodes on both sides of the switching element respectively and also forming a gate electrode on one of both surfaces of the switching element which are fitted with the main electrodes.

A semiconductor device of the aforementioned arrangement is normally kept in a nonconducted state. When, however, there is impressed a trigger (or gate) signal having a magnitude larger than prescribed across the gate electrode and the cathode electrode, then there is introduced into the switching element a flow of electrons or holes through the P-N junction defined by both electrode regions from one of them which acts as an emitter region. The flow of electrons or holes accelerates the further flow of said flow through the remaining P-N junction for their conduction. To bring the conducted switching device back to its nonconducted state, it is only required to decrease a main current between the cathode and anode electrodes to a lower level than the holding current.

With a semiconductor switching device wherein the gate electrode and one of the two semiconductor regions disposed on one of both sides of the element on which the cathode and anode electrodes are positioned are formed by epitaxial growth, or preferably diffusion, the topmost surface of the diffused region contains the highest concentration of impurities and consequently presents the lowest resistance, said impurity concentration grows lower toward the interior of the switching element, resulting in the increased resistance. Accordingly, the aforementioned trigger current flows concentratedly through the topmost part of the element body which is defined between the gate electrode and said one of the main electrodes, so that the flow of electrons or holes introduced into the switching element through the P-N junction defined by both gate and cathode regions also travels concentratedly through the topmost part of the P-N junction. Namely, there is little flow through the inner part of said P-N junction.

However, some portions of said electron or hole flow passing into the switching element through the P-N junction defined by the gate region and cathode region recombine other electrons or holes present above their passage to extinguish themselves. Therefore, the prior act semiconductor switching device wherein the flow of electrons or holes is brought in concentratedly through the topmost part the P-N junction defined by the gate region and cathode region has the drawbacks that the efficiency of electron or hole decreases, and due to the consequential decrease of the gate sensitivity to change the switching device from a nonconducted to a conducted state, there has to be supplied a trigger signal having a relatively large voltage or current value.

To elevate, therefore, the gate sensitivity as much as possible, it is preferred to arrange for a flow of electrons or holes to be brought in through the as much inner part as possible of the P-N junction defined by the gate and cathode regions.

As a means for raising the aforementioned gate sensitivity, there has recently been proposed a device wherein there is formed a continuous shallow groove on the surface of a gate region disposed adjacent to the P-N junction defined by the gate and cathode regions which are positioned on one side of the switching element and across which there is impressed a trigger signal, thereby to allow said trigger current to pass therethrough.

For the present day techniques of manufacturing the aforesaid semiconductor switching element, however, it is extremely difficult to form such a groove with high precision in each product. Formation of said proove is encountered with further disadvantage that there arise prominent variation in the trigger voltage and current value required for each switching device to be brought from a nonconducted to a conducted state.

SUMMARY OF THE INVENTION

The present invention has been accomplished in view of the aforementioned situation and is intended to provide a novel semiconductor switching device wherein there is attained the control of variations in the trigger voltage and current value required for each product to be brought from a nonconducted to a conducted state and the gate sensitivity is also improved.

In an aspect of the present invention three is provided a semiconductor switching device comprising a semiconductor body having at least four regions arranged in succession, the adjacent ones thereof being of different conductivity types, a pair of main electrodes mounted on both sides of the semiconductor body and a gate electrode disposed on that side of the semiconductor body on which there is provided one of the main electrodes and spaced from said main electrode, wherein there is provided a means for obstructing the flow of a gate current on at least part of the surface of the region between the gate electrode and said one main electrode.

DESCRIPTION OF THE PREFERRED EMBODIMENTS

There will now be described by reference to the appended drawings the preferred embodiments of a semiconductor switching device according to the present invention.

Figure 1A:
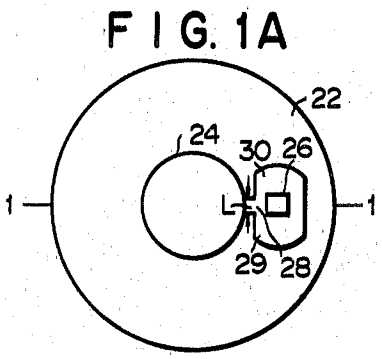
FIG. 1A is a plan view of a thyristor according to a first embodiment of the present invention.
Figure 1B:
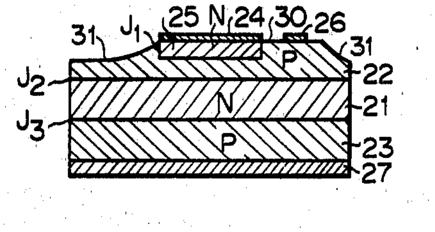
FIG. 1B is a sectional view on line 1 — 1 of FIG. 1A.

FIG. 1A is a plan view of a thyristor according to one of said embodiments and FIG. 1B is a sectional view on line 1 — 1 of FIG. 1A. On both surfaces of an N type silicon semiconductor substrate 21 there are formed by diffusion a P type gate region 22 and an anode region 23 to a depth of about 65 microns and at a surface impurity concentration of about $1 \times 10^{18}$ carries per cubic centimeter. An anode region 23 constitutes one of the main electrodes. On part of the surface of the gate region 22 is deposited a layer of gold-antimony alloy and on the surface of said deposited layer is formed a cathode electrode 24 constituting the other main electrode. Part of the gold-antimony alloy layer is alloyed with part of the gate region 22 positioned immediately below to form an N type cathode region 25 about 20 microns thick. On the gate region 22 and anode region 23 are mounted a gate electrode 26 and anode electrode 27 respectively.

A thyristor according to the present invention having the aforesaid arrangement is prepared by applying corrosion-proof, for example, wax on the shortest area 28 having a suitable width $l$ defined between the gate electrode 26 and cathode electrode 24 as well as on that part 29 of the surface of the gate region 22 which abuts on the periphery of the gate electrode 26 so as to provide a projection 30 which is saved from etching. All the remaining surface of the gate region 22 is etched to a depth of about 20 microns to form a recess 31.

There will now be described the switching operation of a thyristor arranged as described above. Where, with a D.C. voltage having a prescribed value supplied in a forward direction across the cathode electrode 24 and anode electrode 27, there is impressed across the gate electrode 26 and cathode electrode 24 a gate voltage having a larger value than prescribed so as to cause the gate electrode 26 to assume a positive polarity with respect to the cathode electrode 24, then there flows from the gate electrode 26 to the cathode electrode 24 a gate current corresponding to the magnitude of said gate voltage. In this case, said gate current passes concentratedly through the surface of the aforementioned projection 30 which is saved from etching and has a far smaller resistance than the recess 31 formed by etching. Accordingly, there is introduced a flow of electrons into the switching device from the cathode region 25 concentratedly through particularly that part of the P-N junction $J_1$ defined by the gate region 22 and cathode region 25 which abuts on the projection 30. The influx of said electrons reaches the anode region 23 through the back biased P-N junction $J_2$ defined by the gate region 22 and substrate 21 and then through the P-N junction $J_3$ defined by the substrate 21 and anode region 23, thereby bringing the thyristor to a conducted state from the nonconducted state where the cathode electrode 24 and anode electrode 27 are electrically shut off from each other with a semiconductor switching device provided with the aforesaid projection 30 and recess 31, the trigger current flows in high density concentratedly through the projection 30, enabling said device to be brought from a nonconducted to a conducted state by a smaller gate voltage and current than in the prior art device.

A minimum magnitude of voltage and current capable of conducting the switching device may be controlled by the width $l$ of the shortest area 28 defined between the gate electrode 26 and cathode electrode 24. That is, the narrower said width $l$, the smaller will be the requirement of trigger voltage and current for the switching operation of said semiconductor device. If, however, said shortest area 28 has an unduly narrow width $l$, then there will prominently appear the so-called hot spot, most likely causing the P-N junction defined by the gate region 22 and cathode region 25 to be thermally destroyed. Accordingly, said shortest area 28 is desired to have a width $l$ of at least about 100 microns.

There will be given below actually measured minimum requirements of voltage $V_{gt}$ and current $I_{gt}$ with respect to various widths $l$ of the shortest area 28.

i. Device lacking the recess 31

$$V_{gt} \approx 1.3 \text{ volts } I_{gt} \approx 133 \text{ milliamperes}$$

ii. Device wherein the surface of the projection 30 has a width $l$ of 200 microns $V_{gt} \approx 1.3$ volts Current passing through said surface $I_{gt} \approx 65$ milliamperes iii. Device wherein the surface of the projection 30 has a width $l$ of 130 microns $V_{gt} \approx 1.3$ volts Current passing through said surface $I_{gt} \approx 36$ milliamperes Further with the present semiconductor device, the value of voltage and current required for the device to be switched from a nonconducted to a conducted state is prominently saved from the effect of different depths of the recess 31 than in the prior art device having a shallow continuous groove, namely, can be substantially controlled simply by adjusting the width $l$ of the shortest area. Moreover, said width $l$ can be controlled with extremely higher precision even by the present day manufacturing techniques than the depth of the shallow groove involved in the conventional device, offering the advantage of reducing variations in the properties of each product.

The non-etched projection 30 is only required to include the shortest area 28. In other words, that part 29 of the projection 30 which abuts on the periphery of the gate electrode 20, excluding said shortest area 28, need not be saved from etching.

Figure 2A:
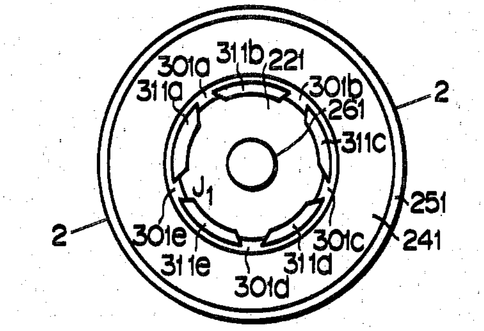
FIG. 2A is a plan view of a thyristor according to a second embodiment of the invention.
Figure 2B:
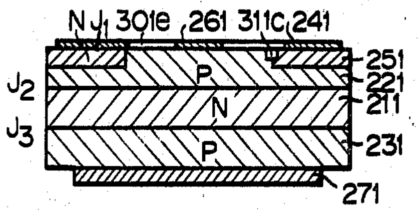
FIG. 2B is a sectional view on line 2 — 2 of FIG. 2A.

FIG. 2A is a plan view of a thyristor according to a second embodiment of the present invention and FIG. 2B is a sectional view on line 2 — 2 of FIG. 2A. According to the embodiment of FIG. 2, there is mounted on the periphery of an almost circular gate region 221 a substantially annular cathode region 251. The interfaces of the gate and cathode regions 221 and 251 define a substantially annular P-N junction $J_1$. Along a relatively narrow annular portion including the gate region 221 and cathode region 251 positioned inside and outside of the annular P-N junction $J_1$ respectively there are formed, for example, five separate band-shaped etched recesses 311*a*, 311*b*, 311*c*, 311*d* and 311*e* at a substantially equal peripheral space so as to provide five projections 301*a*, 301*b*, 301*c*, 301*d* and 301*e*. Substantially at the central part of the gate region 221 is disposed a circular gate electrode 261. Along the substantially central line of the width of the annular cathode region 251 is provided an annular cathode electrode 241.

A thyristor of the aforementioned construction permits the trigger voltage to pass through the projections 301*a* to 301*e* at the same time, so that it has an effect of reducing the occurrence of a hot spot phenomenon described in the embodiment of FIG. 1. In this case, it is preferred for the best possible decreasing the gate trigger current that the part of each of the projections 301*a* to 301*e* facing the trigger current inlet side (or the gate region 221 in this embodiment) be so formed as to have a broadest possible width as illustrated in FIG. 2. And to allow the trigger current to be introduced in as high density as possible, it is desired that the part of each of said projections 301*a* to 301*e* facing the trigger current outlet side (or the cathode region 251 in this embodiment) be formed as narrow as possible.

Figure 3A:
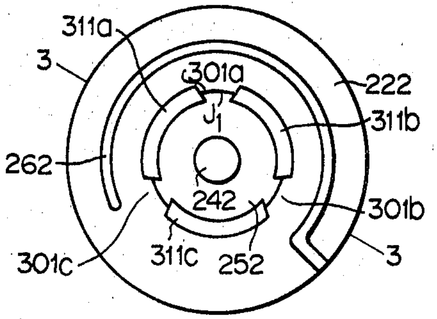
FIG. 3A is a plan view of a thyristor according to a third embodiment of the invention.
Figure 3B:
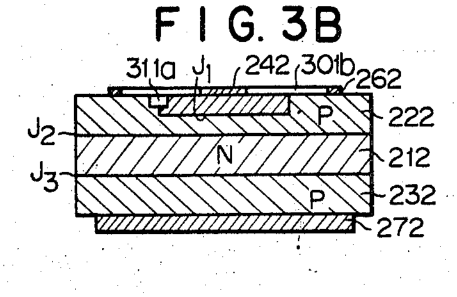
FIG. 3B is a sectional view on line 3 — 3 of FIG. 3A.

FIG. 3A is a plan view of a thyristor according to a third embodiment of the present invention and FIG. 3B is a sectional view on line 3 — 3 of FIG. 3A. In this embodiment, the gate region 222 and cathode region 252 are reversed in position from the embodiment of FIG. 2. On the surface of the gate region 222 is mounted a substantially semicircular annular gate electrode 262. The same parts of FIGS. 2A, 3A, 2B and 3B as those of FIGS. 1A and 1B respectively are denoted by the corresponding numerals and description thereof is omitted.

Figure 4A:
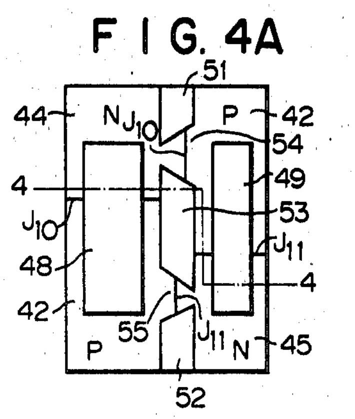
FIG. 4A is a plan view of a triac according to a fourth embodiment of the invention.
Figure 4B:
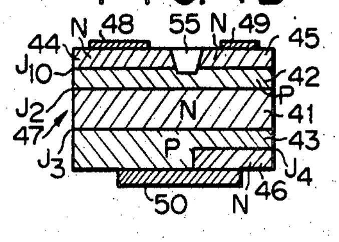
FIG. 4B is a sectional view on line 4 — 4 of FIG. 4A.

FIGS. 4A and 4B are the plan and sectional views of a triac according to a fourth embodiment of the present invention. There are formed by diffusion on both sides of a substantially rectangular N type semiconductor substrate 41 having an impurity concentration of about $2.5 \times 10^{14}$ carriers per cubic centimeter a pair of P type regions 42 and 43 about 50 microns thick having a surface impurity concentration of about $1 \times 10^{18}$ carriers per cubic centimeter. In one P type region 42 are formed a pair of N type regions 44 and 45 in such a manner that said P type region 42 is exposed at the respective corners defining one diagonal line of the rectangular substrate 41 and at the central part connecting said corners and said N type regions 44 and 45 are separately disposed at the opposite corners defining the other diagonal line. In the other P type region 43 is formed one N type region 46. There is prepared a semiconductor element 47 having five P-N junctions $J_{10}$, $J_{11}$, $J_2$, $J_3$ and $J_4$. On that side of the semiconductor element 47 on which there are mounted said pair of N type regions 44 and 45, there are disposed one main electrode 48 and gate electrode 49 so as to short-circuit the P type region 42 with the N type regions 44 and 45. On the other side of the semiconductor element 47 is positioned the other main electrode 50 so as to short-circuit the P type region 43 and N type region 46 with each other. In a bilateral thyristor of triac according to the present invention constructed as described above, there are formed band-shaped etched recesses 51 and 52 on both sides of the two P-N junctions $J_{10}$ and $J_{11}$ respectively lying between one main electrode 48 mounted on one side of the semiconductor element 47 and gate electrode 49 in such a manner that the recess 51 bridges the P type region 42 and N type region 44 and the recess 52 bridges the P type region 42 and N type region 45. There is further provided one band-shaped etched recess 53 spaced about 100 to 200 microns from the aforesaid two recesses 51 and 52 so as to bridge said two P-N junctions $J_{10}$ and $J_{11}$. In the spaces defined by said recess 53 with the aforementioned recesses 51 and 52 are provided nonetched projections 54 and 55.

There will now be described the switching operation of a triac prepared in the aforementioned manner.

i. Where, with one main electrode 50 positively biased with respect to the other main electrode 48, the latter main electrode 48 is supplied with a positive signal from the gate electrode 49, then a gate current resulting from said signal, while kept at a small value, flows from the short circuited section of the junction $J_{11}$ facing the gate region to the short circuited section of the junction $J_{10}$ facing the main electrode section 44. If, however, said gate current increases until a lateral voltage drop caused by a current passing along the junction $J_{10}$ of the main electrode region 44 exceeds the potential of the junction $J_{10}$ (such gate current is known as a trigger current), then part of said trigger current will be conducted to the junction $J_{10}$ of the main electrode region 44, thereby causing a flow of electrons to be introduced from that part of the main electrode region 44 into the semiconductor device. Accordingly, the other parts of the semiconductor device than the N type region 46 constitute an equivalent thyristor to that of FIG. 1. In this case, said N type region 46 is short-circuited with the P type region 43 by the main electrode 50 and does not perform any action.

Such condition is hereinafter referred to as "a first quadrant gate electrode plus".

ii. If, in case the main electrode 48 is positively biased with respect to the main electrode 50 and the main electrode 48 is supplied from the gate electrode 49 a positive signal with respect to the main electrode 48, the gate current resulting from said signal rises to the level of a trigger current as described in item (*i*) above, then there will occur the influx of a flow of electrons from the main electrode region 48 through the P-N junction $J_{10}$. In this case, however, the P-N junction $J_3$ is reversely biased unlike the case of an ordinary thyristor, preventing the semiconductor device from being immediately switched from a non-conducted to a conducted state by said injected electron. When large amounts of electrons flow from the main electrode region to the gate region 42 and then to the P-N junction $J_2$, the potential of said junction will decrease to cause a flow of holes to travel from the gate region 42 to the substrate 41. The hole flow thus brought in is diffused through the substrate 41 to the reversely biased P-N junction $J_3$, promoting the influx of electrons from the N type region on the opposite side of the semiconductor device to the main electrode 43 to conduct said P-N junction $J_3$ and eventually switch the semiconductor device from a nonconducted to a conducted state. This means the same thing that there is transmitted a trigger signal from the remote gate electrode 49 to the thyristor except for a pair of N type regions 44 and 45 on the upper side of the semiconductor device.

This condition is hereinafter referred to as "a third quadrant plus".

iii. Where the main electrode 50 is positively biased with respect to the main electrode 48 and supplied from the gate electrode 49 a negative signal with respect thereto, the semiconductor device as a whole functions in the same way as in item (ii) above, excepting that the operation of the gate region 42 and main electrode region 44 is reversed from the case of said item (ii). Namely, the section between the gate electrode 49 and main electrode 50 is first switched from a nonconducted to a conducted state and then the section between both main electrodes 48 and 50 is brought to a conducted state.

This condition is hereinafter referred to a "a first quadrant gate minus".

iv. Where the main electrode 48 is positively biased with respect to the main electrode 50 and supplied from the gate electrode 49 a negative signal with respect to the main electrode 48, the semiconductor device as a whole functions in the same way as in item (iii) above excepting that the operation of the gage electrode 42 and main electrode region 44 is reversed from the case of said item (iii).

In a triac of the present invention performing the aforementioned switching operation, there are formed three discontinuous etched recesses 51, 53 and 52 on that part of the surface of the semiconductor element 47 which is defined between said one main electrode 48 and gate electrode 49, with nonetched projections 54 and 55 interposed between every adjacent recess. Accordingly, the trigger current flows concentratedly through the nonetched projections 54 and 55 in high density, enabling the semiconductor device to be conducted by a relatively small voltage and current with the resulting elevation of the gate sensitivity.

Figure 5A:
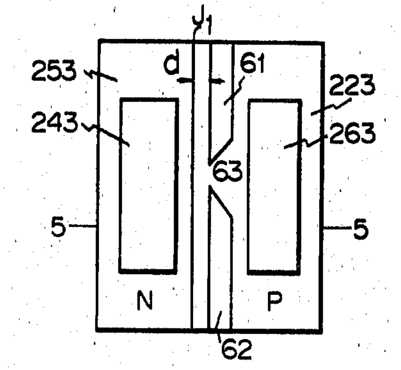
FIG. 5A is a plan view of a thyristor according to a fifth embodiment of the invention.
Figure 5B:
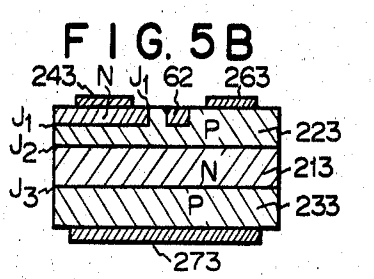
FIG. 5B is a sectional view on line 5 — 5 of FIG. 5A.

FIG. 5A is a plan view of a thyristor according to a fifth embodiment of the present invention and FIG. 5B is a sectional view thereof. In the embodiments of FIGS. 1 to 4 there are formed a plurality of discontinuous etched recesses with the aforesaid nonetched projections interposed between every adjacent recess as a means for preventing the flow of a surface trigger current across the gate electrode and one of the main electrodes so as to elevate the gate sensitivity when the semiconductor device is switched from a nonconducted to a conducted state.

In the embodiment of FIGS. 5A and 5B, however, there are formed instead of the aforesaid etched recesses a pair of band-shaped shielding regions 61 and 62 having the same N conductivity type as a cathode region 253 at a space of about 50 microns on the surface of a P type gate region 223 positioned on the side of the semiconductor element between a gate electrode 263 and a cathode electrode 243. These shielding regions 61 and 62 may be formed by a well-known diffusion technique.

A thyristor thus prepared not only has the same effect as the thyristor of FIG. 1, but also has the advantage that it can generally be fabricated with greater ease and higher precision than that which is provided with etched recesses as in FIGS. 1 to 4 and, leading to improved product quality and said fabrication can be formed at the same time as the formation of the cathode region 253 using a proper mask.

If the aforementioned band-shaped shielding regions 61 and 62 are disposed too far from the P-N junction $J_1$ defined by the gate region 223 and cathode region 253, then the trigger current which favorably flowed in high density concentratedly through the gate electrode 263, gate region 223 and then through a gap 63 between both band-shaped shielding regions 61 and 62 will be reduced in density when it reached the P-N junction $J_1$. Accordingly, it is preferred that said shielding regions be positioned as much adjacent as possible to the P-N junction $J_1$, insofar as they are not short-circuited with the P-N junction $J_1$. Experiments show that the distance between the P-N junction $J_1$ and said shielding regions 61 and 62 is preferred to be about 50 to 80 microns. In the embodiment of FIGS. 5A and 5B said distance is set at about 60 microns.

Figure 6A:
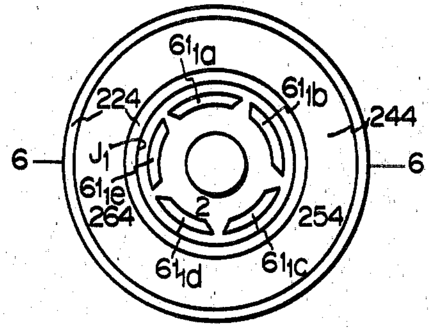
FIG. 6A is a plan view of a thyristor according to a sixth embodiment of the invention.
Figure 6B:
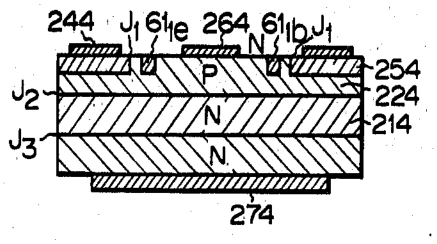
FIG. 6B is a sectional view on line 6 — 6 of FIG. 6A.

FIG. 6A is a plan view of a thyristor according to a sixth embodiment of the present invention and FIG. 6B is a sectional view thereof. This embodiment corresponds to that of FIG. 2. There are formed instead of the etched recesses 311*a* to 311*e* of FIG. 2 five band-shaped shielding regions 611*a*, 611*b*, 611*c*, 611*d* and 611*e* having the same N conductivity as that of a cathode region 254.

Figure 7A:
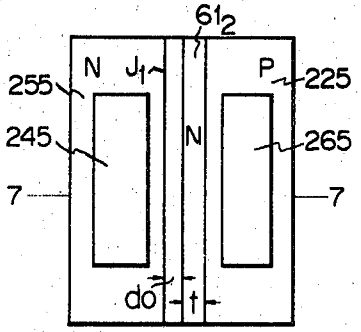
FIG. 7A is a plan view of a thyristor according to a seventh embodiment of the invention.
Figure 7B:
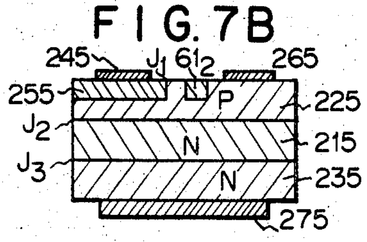
FIG. 7B is a sectional view on line 7 — 7 of FIG. 7A.

FIG. 7A is a plan view of a thyristor according to a seventh embodiment of the present invention and FIG. 7B is a sectional view thereof. In this embodiment there is formed on the gate region 225 between a gate electrode 265 and cathode electrode 245 a single continuous shielding region $61_2$ instead of the plural discontinuous band-shaped shielding regions used in the embodiments of FIGS. 5 and 6 in a manner to be stretched and extend across both ends of the semiconductor element thereby to fully separate the gate and cathode electrodes.

In a thyristor arranged as described above, the trigger current introduced from the gate electrode 265 through the gate region 225 to the P-N junction $J_1$ defined between said gate region 225 and cathode region 255 does not all flow through the surface of the semiconductor device, but passes under the band-shaped shielding region $61_2$ to said P-N junction $J_1$. As apparent from the above description, therefore, a semiconductor device of FIG. 7 permits the influx of electrons from the cathode region 245 through a deeper part of the P-N junction than in any of the embodiments of FIGS. 1 to 6, resulting in a more elevated gate sensitivity. However, if in this case the band-shaped shielding region $61_2$ has an unduly broad width t, it will present a greater resistance to a trigger current running thereunder, namely, requiring larger amounts of trigger current to be supplied in order to attain the desired object. Accordingly, it is preferred that the width of said band-shaped shielding region $61_2$ be as narrow as possible.

Further, if the distance $d_0$ between the shielding region $61_2$ and P-N junction $J_1$ is too large, the trigger current passing under said region $61_2$ will be undesirably again diverted to the surface face of the gate region 225 containing high concentrations of impurities. Accordingly, it is preferred that said distance $d_0$ being about 50 microns substantially as in FIGS. 5 and 6. Further it is desired that said shielding region $61_2$ capable of being provided at the same time as the formation of the cathode region 255 be diffused to a depth of from about 15 to 30 microns.

Figure 8A:
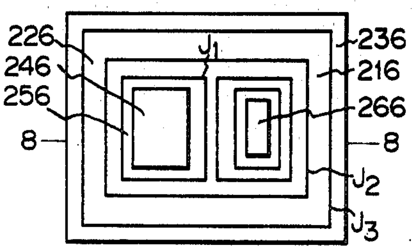
FIG. 8A is a plan view of a thyristor according to an eighth embodiment of the invention.
Figure 8B:
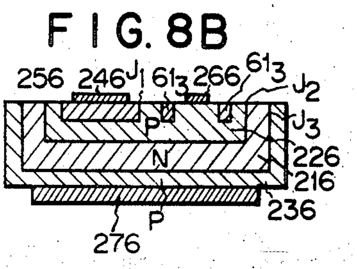
FIG. 8B is a sectional view on line 8 — 8 of FIG. 8A.

FIG. 8A is a plan view of a planar type thyristor according to an eighth embodiment of the present invention and FIG. 8B is a sectional view thereof. In this embodiment, all the P-N junctions $J_1$, $J_2$ and $J_3$ are exposed to one surface of a semiconductor device. With such planar type thyristor, the aforementioned band-shaped shielding region to prevent the flow of a surface trigger current fails to be extended up to the end of the semiconductor device as in the embodiment of FIG. 7, so that there is formed a band-shaped shielding region $61_3$ so as to surround the periphery of a gate electrode 226 (and/or a cathode region 246).

Such planar type thyristor has the same effect as the embodiment of FIG. 7.

Figures 9A, 9B, 10A, 10B, 11A, 11B, 12A, 12B:
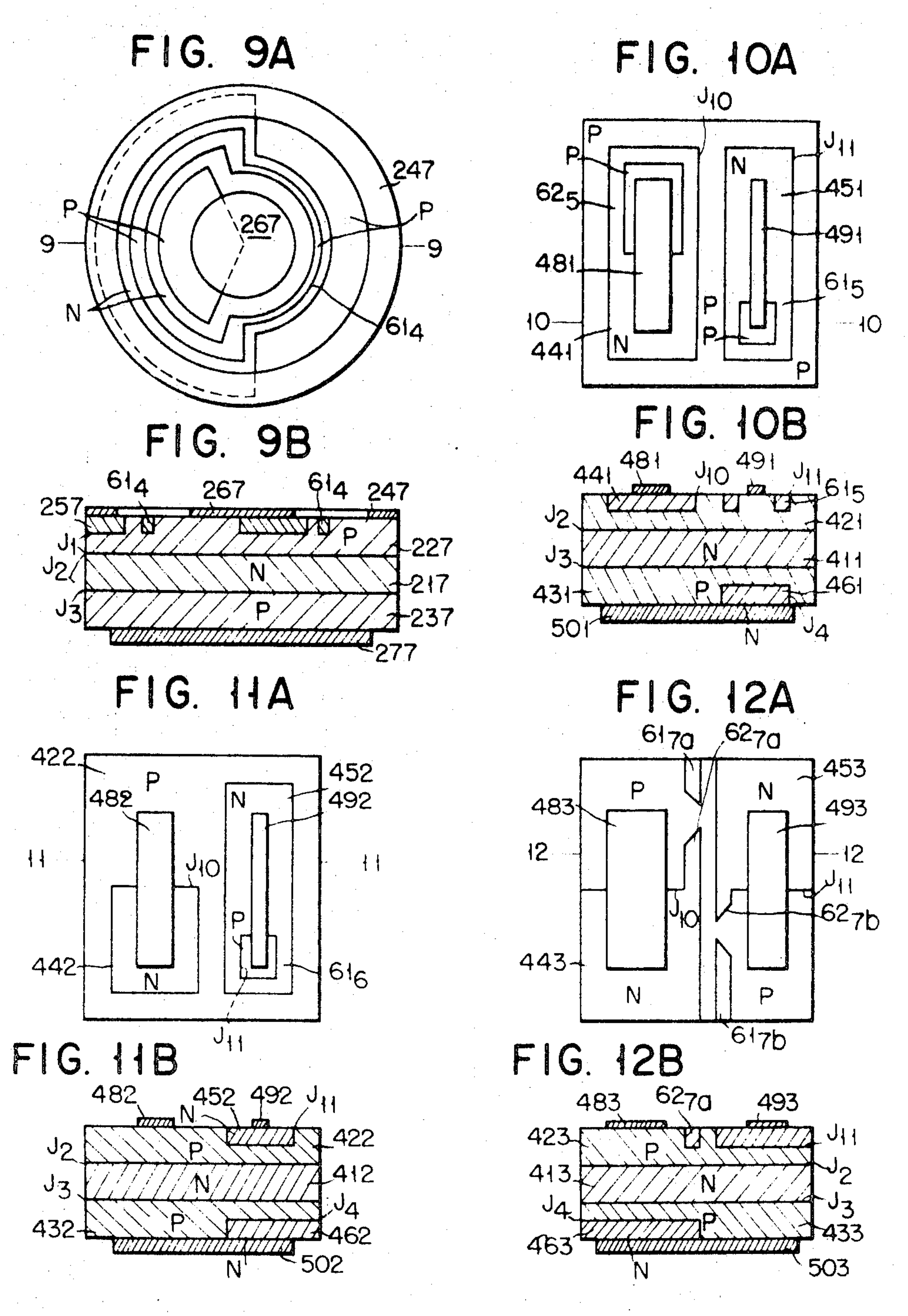
FIG. 9A is a plan view of a triac according to a ninth embodiment of the invention.
FIG. 9B is a sectional view on line 9 — 9 of FIG. 9A.
FIG. 10A is a plan view of a triac according to a tenth embodiment of the invention.
FIG. 10B is a sectional view on line 10 — 10 of FIG. 10A.
FIG. 11A is a plan view of a triac according to an eleventh embodiment of the invention.
FIG. 11B is a sectional view of a triac on line 11 — 11 of FIG. 11A.
FIG. 12A is a plan view of a triac according to a twelfth embodiment of the invention.
FIG. 12B is a sectional view on line 12 — 12 of FIG. 12A.

FIG. 9A is a plan view of a triac according to a ninth embodiment of the present invention and FIG. 9B is a sectional view thereof. The triac of FIG. 9 is prepared by placing the gate of the triac of FIG. 10 in the center of the semiconductor device.

FIG. 10A is a plan view of a triac according to a tenth embodiment of the present invention and FIG. 10B is a sectional view thereof. In this embodiment there are provided two band-shaped shielding regions $61_5$ and $62_5$ so as to surround all the periphery of a gate electrode 491 and one main electrode 481 respectively. Following the same suffix notation applied in the previous figures, a first emitter region 441 is formed adjacent to one main surface of the body. A first adjacent region having a conductivity type opposite to that of said emitter region is identified by the numeral 421 and a part of this region is exposed to said one main surface of the body. Mounted on the same surface is a plate or ribbon shaped main ohmic electrode 481 arranged to short-circuit the first emitter region 441 and the first adjacent region 421. A gate emitter region 451 having the same conductivity type as the first emitter region 441 is formed close to said one main surface within said first adjacent region 421. A plate or ribbon shaped gate electrode 491 is formed on said one main surface so as to short-circuit the gate emitter region 451 and the first adjacent region 421. On the opposite main surface of the body there is a second emitter region 461 positioned within a second adjacent region 431 having a conductivity type opposite to that of said second emitter region. The other main ohmic electrode 501 is disposed on said opposite main surface so as to short-circuit the second emitter region 461 and the second adjacent region 431.

FIG. 11A is a plan view of a triac according to an eleventh embodiment of the present invention and FIG. 11B is a sectional view thereof. In this embodiment, there is disposed a band-shaped shielding region $61_6$ so as not to surround the periphery of one main electrode 482 but only that of the gate electrode 492.

If, in case the semiconductor device is in a nonconducted state, both main electrodes should be supplied with a sharply rising voltage, then said device would be erroneously conducted. Even in such case, the triac of FIG. 11 has the effect of better controlling the rising ratio $dv/dt$ of said voltage than the triac of FIG. 10.

FIG. 12A is a plan view of a triac according to a twelfth embodiment of the present invention and FIG. 12B is a sectional view thereof. In this embodiment there are disposed between a gate electrode 493 and one main electrode 483 two pairs of discontinuous band-shaped shielding regions $61_{7a}$ – $62_{7a}$ and $61_{7b}$ – $62_{7b}$ like the paired discontinuous band-shaped shielding regions 61 and 62 involved in the thyristor of FIG. 5.

Figure 13A:
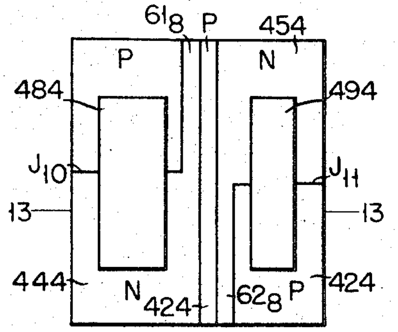
FIG. 13A is a plan view of a triac according to a thirteenth embodiment of the invention.
Figure 13B:
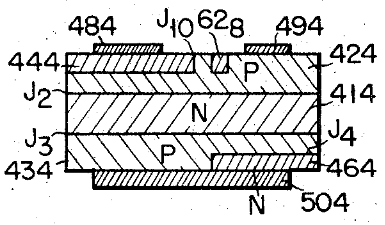
FIG. 13B is a sectional view on line 13 — 13 of FIG. 13A.

FIG. 13A is a plan view of a triac according to a thirteenth embodiment of the present invention and FIG. 13B is a sectional view thereof. In this embodiment there are formed between a gate electrode 494 and one main electrode 484 two discontinuous band-shaped shielding regions $61_8$ and $62_8$ like the continuous shielding region $61_2$ used in the thyristor of FIG. 7.

Figure 14A:
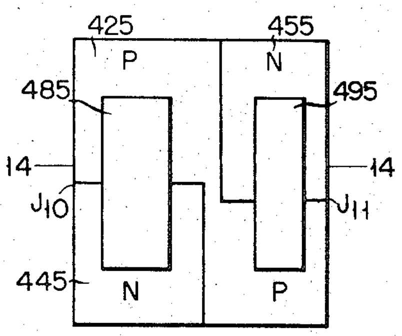
FIG. 14A is a plan view of a triac according to a prior art.
Figure 14B:
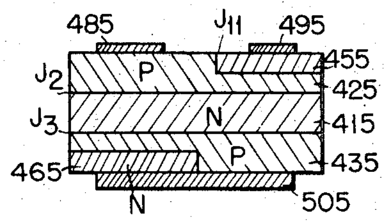
FIG. 14B is a sectional view on line 14 — 14 of FIG. 14A.

FIG. 14A is a plan view of a triac according to a prior art and FIG. 14B is a sectional view thereof. This triac is not provided with the aforementioned semiconductor shielding region. Those parts of the surface of the P type region 425 on which there are mounted the gate electrode 495 and one main electrode 485 communicate with each other.

Figure 15A:
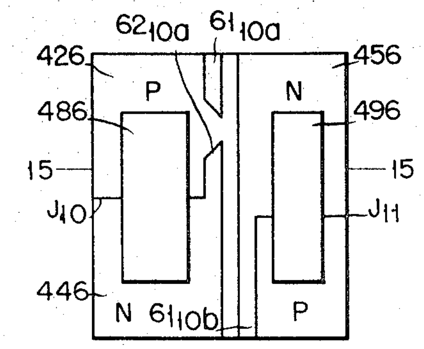
FIG. 15A is a plan view of a triac according to a fourteenth embodiment of the invention.
Figure 15B:
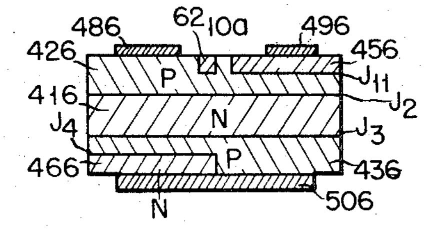
FIG. 15B is a sectional view on line 15 — 15 of FIG. 15A.

FIG. 15A is a plan view of a triac according to a fourteenth embodiment of the present invention and FIG. 15B is a sectional view thereof. There are provided between a gate region 496 and one main electrode 486 one continuous band-shaped region $61_{10b}$ like the continuous shielding region $61_2$ of the thyristor of FIG. 7 and a pair of discontinuous band-shaped shielding regions $61_{10a}$ and $62_{10a}$ (which may be formed into a continuous type like the aforesaid shielding region $61_{10b}$) like a pair of discontinuous shielding regions 61 and 62 of the thyristor of FIG. 5, thereby dividing the surface of the gate region 426 into two (or three) parts by said continuous shielding region $61_{10b}$.

There were conducted experiments on the triacs arranged as in FIGS. 14 and 15 to find a minimum requirement of trigger voltage $V_{gt}$ and current $I_{gt}$ for them to be switched from a nonconducted to a conducted state, the results being presented in Table 1 below.

Table 1

Minimum requirements of trigger voltage and current

| | Operable State | | | |
|---|---|---|---|---|
| | Triac of FIG. 14 | | Triac of FIG. 15 | |
| Sample | $I_{gt}$ (mA) | $V_{gt}$ (V) | $I_{gt}$ (mA) | $V_{gt}$ (V) |
| 1st quadrant gate electrode plus | 7 | 2 | 1 | 1 |
| 1st quadrant gate electrode minus | 4 | 1.5 | 1 | 0.6 |
| 3rd quadrant gate electrode plus | 18 | 3 | 1.5 | 0.6 |
| 3rd quadrant gate electrode minus | 7 | 1.5 | | |

As apparent from the table above, with the conventional triac shown in FIG. 14, the trigger current flows concentratedly through those parts of the surface of the P type region 425 which communicate with each other, obstructing the influx of electrons from the N type regions 445 or 455. Accordingly, there has to be supplied a great deal of trigger current in order to enable the semiconductor device to be switched from a nonconducted to a conducted state.

Figure 16A:
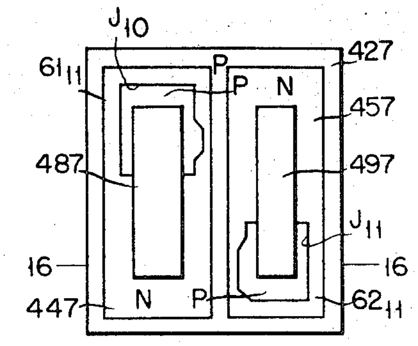
FIG. 16A represents a plan view of a triac according to a fifteenth embodiment of the invention.
Figure 16B:
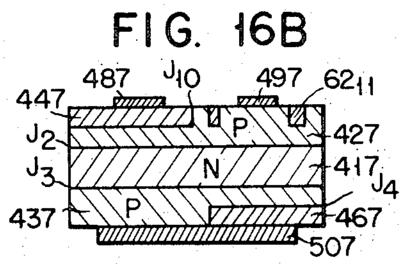
FIG. 16B is a sectional view on line 16 — 16 of FIG. 16A.

FIG. 16A is a plan view of a triac according to a fifteenth embodiment of the present invention and FIG. 16B is a sectional view thereof. The aforementioned band-shaped shielding region intended to obstruct the passage of a surface trigger current is desired to have as broad a width as possible at those places when there should be avoided the flow of said trigger current and as narrow a width as possible at those parts below said shielding region through which said trigger current is desired to pass. The embodiment of FIG. 16 represents a triac prepared from this consideration. There are formed band-shaped shielding regions $61_{11}$ and/or $62_{11}$ so as to surround the periphery of a gate electrode 497 and/or one main electrode 487. Only those parts of said shielding regions $61_{11}$ and/or $62_{11}$ which closely face the P-N junctions $J_{10}$ and/or $J_{11}$ are made narrower than the other parts.

There will now be described experiments carried out to determine the relationship of diffused depth versus resistance value of a semiconductor shielding region as used in FIGS. 5 to 16 which was intended to act as a means for obstructing the flow of a surface trigger current. There was diffused on an N type semiconductor substrate having an impurity concentration of, for example, $2.5 \times 10^{14}$ carriers per cubic centimeter a P type region having a surface impurity concentration of about $1 \times 10^{18}$ carriers per cubic centimeter to a thickness of about 50 microns. On part of said P type region, there was formed an N type semiconductor region about 25 microns thick.

With a semiconductor device constructed as described above, where there was not provided the aforementioned N type semiconductor region, the resistance of the P type semiconductor region 1 cm wide and 1 cm long stood at several ohms, whereas, when said N type semiconductor region was formed, the resistance of the P type semiconductor region across said N type region increased to about 350 ohms. When said N type semiconductor region was diffused to a depth of about 30 microns, the resistance of said P type semiconductor region across said N type region rose as high as 1000 ohms.

What we claim is:

1. In a triac of the type having a semiconductor body in which the adjacent regions are of opposite conductivity and in which a plurality of continuous areas defining P-N junctions are formed on the boundary between said adjacent regions, one of said regions constituting a first emitter region which is adjacent to one main surface of said body and also defined within a first adjacent region having a conductivity type opposite to that of said emitter region, part of said first adjacent region being exposed to said one main surface, one plate or ribbon shaped ohmic electrode so mounted on said one main surface as to short-circuit said first emitter region with said first adjacent region, a gate-emitter region with the same conductivity type as said first emitter region formed close to said one main surface within said first adjacent region, a plate or ribbon shaped gate electrode so formed on said one main surface as to short-circuit said gate-emitter region with said first adjacent region, one of the regions adjacent to the opposite main surface of said body opposite to said one main surface thereof which constitutes a second emitter region positioned within a second adjacent region having a conductivity type opposite to that of said second emitter region, part of said second adjacent region being exposed to said opposite main surface, and the other main ohmic electrode so disposed on said opposite main surface as to short-circuit said second emitter region with said second adjacent region, the improvement comprising:

a semiconductor region, substantially U-shaped and surrounding only the periphery of one end of said gate electrode projected to said one main surface and stopping short of the end face of the surface of said first adjacent region for obstructing the flow of trigger current on the surface portion of said body between said gate electrode and said one main ohmic electrode.

2. A semiconductor switching device according to claim 1 wherein that part of said blocking semiconductor region which faces said gate electrode and one main electrode positioned close thereto is narrower than the other parts thereof.

* * * * *